(12) United States Patent
Sato

(10) Patent No.: US 8,867,225 B2
(45) Date of Patent: Oct. 21, 2014

(54) WIRING BOARD

(71) Applicant: Shinko Electric Industries Co., Ltd., Nagano (JP)

(72) Inventor: Junji Sato, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 13/973,346

(22) Filed: Aug. 22, 2013

(65) Prior Publication Data
US 2014/0063763 A1 Mar. 6, 2014

(30) Foreign Application Priority Data
Aug. 30, 2012 (JP) ................................. 2012-190381

(51) Int. Cl.
*H05K 1/18* (2006.01)
(52) U.S. Cl.
CPC ...................................... *H05K 1/184* (2013.01)
USPC ............................ 361/761; 361/760; 361/748
(58) Field of Classification Search
USPC .......................................... 361/761, 760, 748
See application file for complete search history.

(56) References Cited

U.S. PATENT DOCUMENTS
2006/0272853 A1* 12/2006 Muramatsu et al. .......... 174/262

FOREIGN PATENT DOCUMENTS
JP 2006-339482 12/2006

* cited by examiner

*Primary Examiner* — Andargie M Aychillhum
(74) *Attorney, Agent, or Firm* — Rankin, Hill & Clark LLP

(57) ABSTRACT

A wiring board includes: a core layer having a through hole therethrough and comprising a first surface and a second surface opposite to the first surface; a first wiring layer formed on the first surface of the core layer and having a first opening which is communicated with the through hole, wherein an opening area of the first opening is larger than that of the through hole in a plan view; an electronic component disposed in the through hole and the first opening and having a first surface, and a second surface opposite to the first surface, the electronic component further having a pair of terminal on the first surface thereof; and a first resin layer filled in the through hole, the first opening and a gap between the pair of terminals so as to cover the second surface and the side surface of the electronic component.

6 Claims, 12 Drawing Sheets

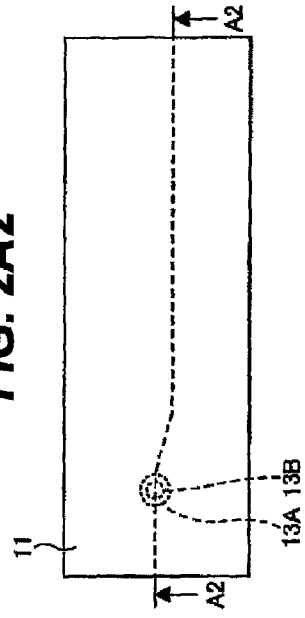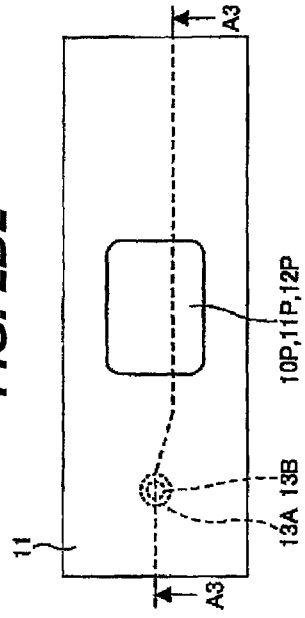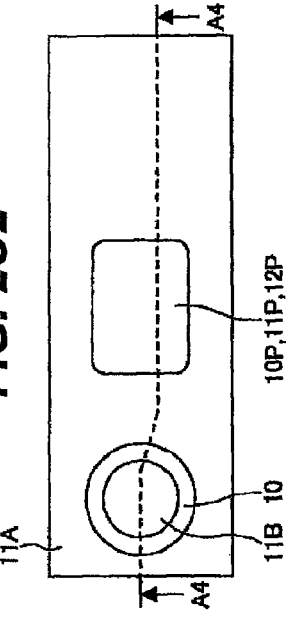
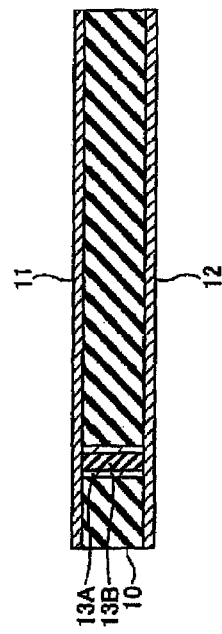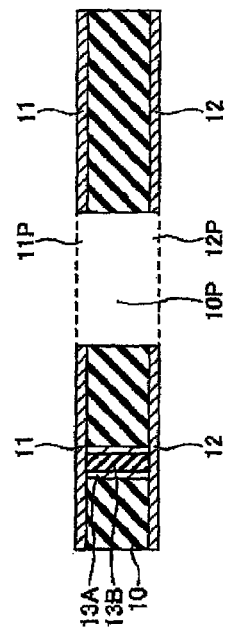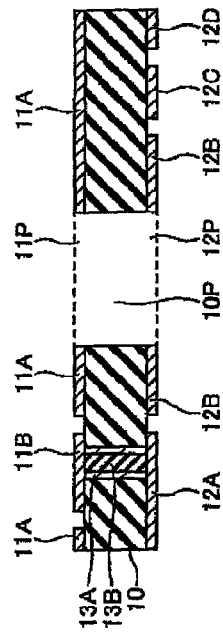

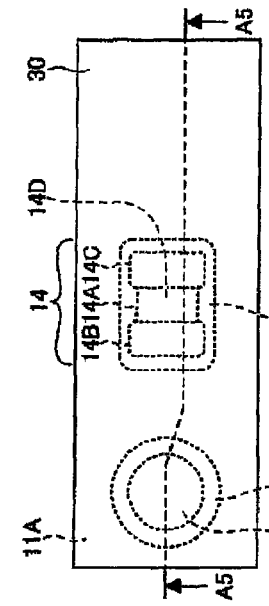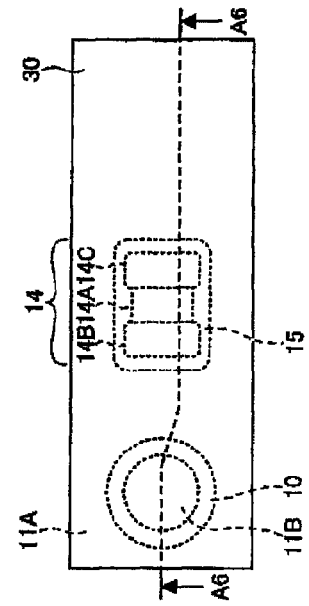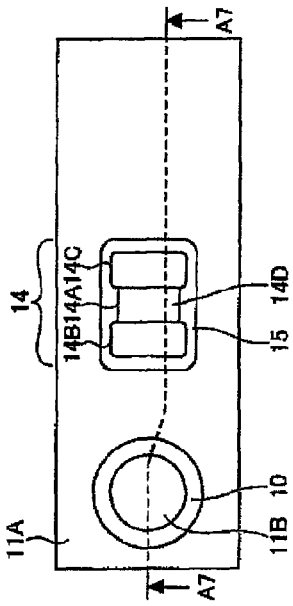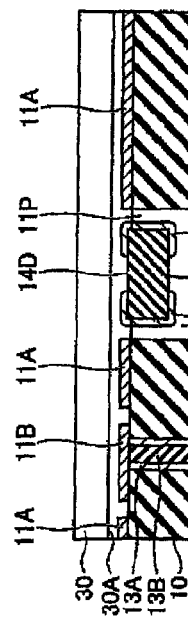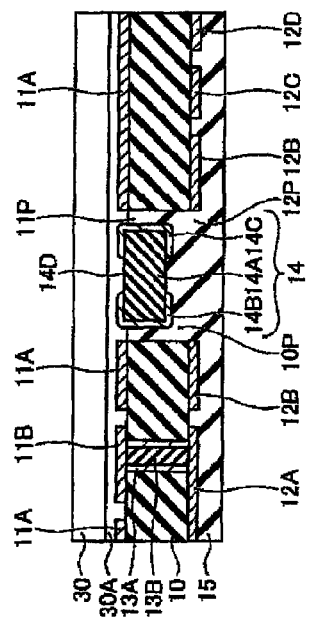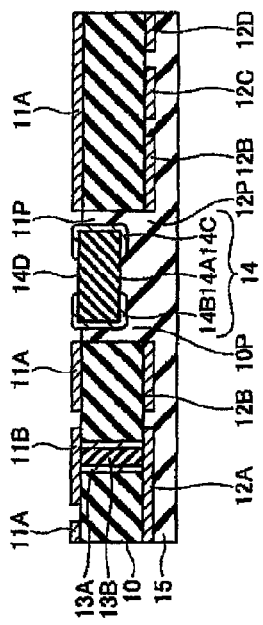

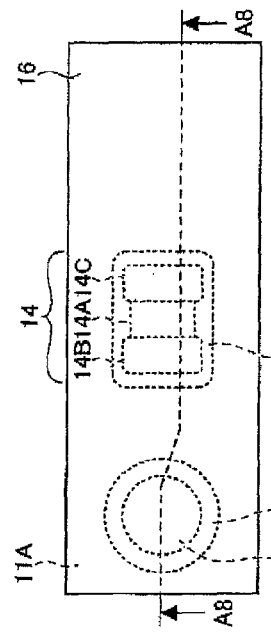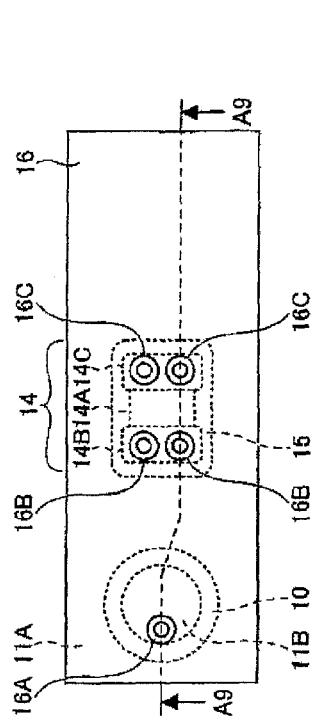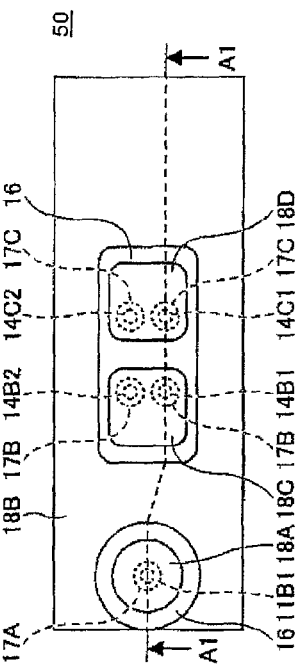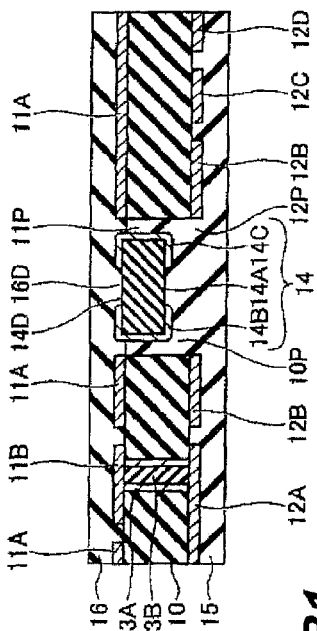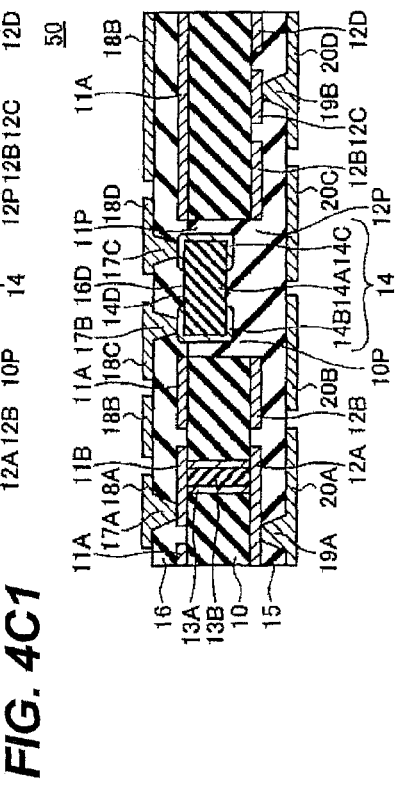
FIG. 4A2
FIG. 4B2
FIG. 4C2
FIG. 4A1
FIG. 4B1
FIG. 4C1

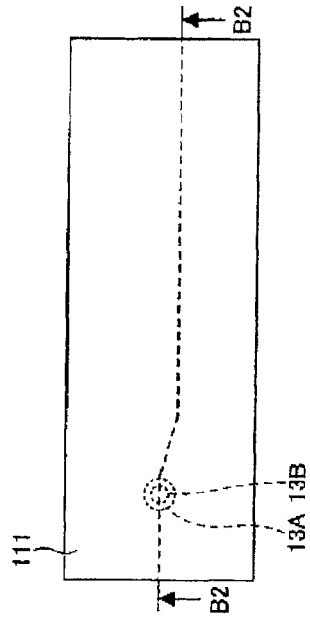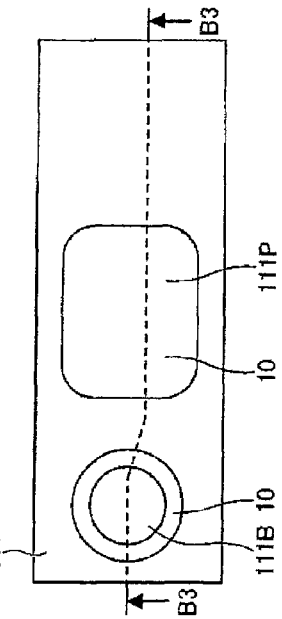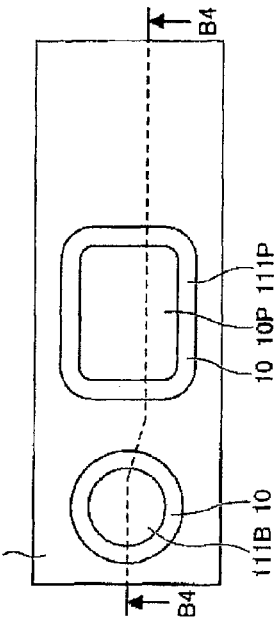
FIG. 8A2  FIG. 8B2  FIG. 8C2
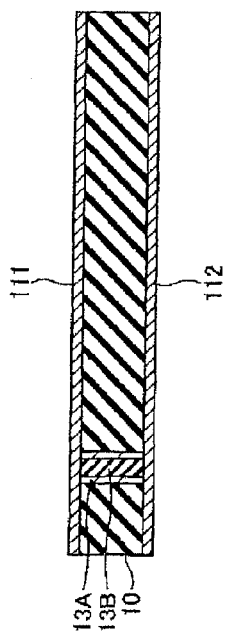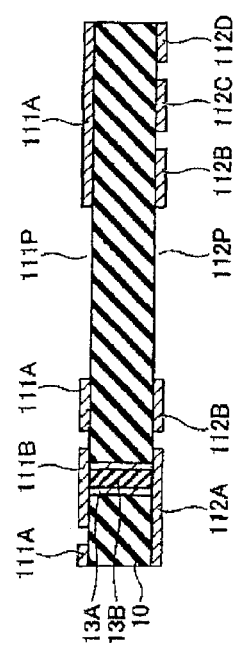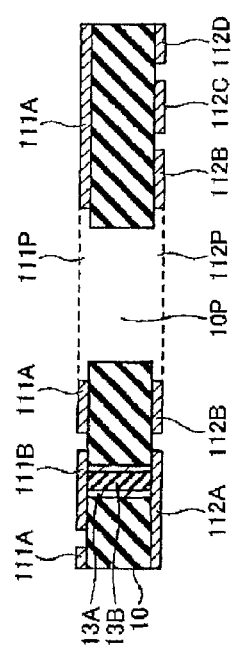
FIG. 8A1  FIG. 8B1  FIG. 8C1

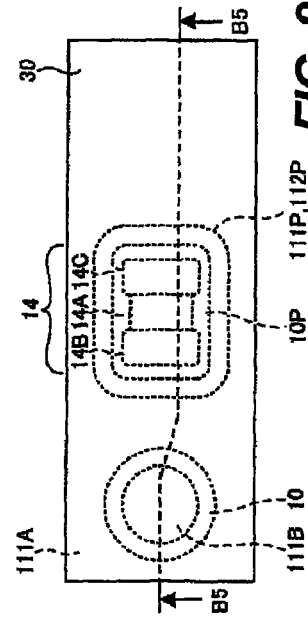
FIG. 9A2
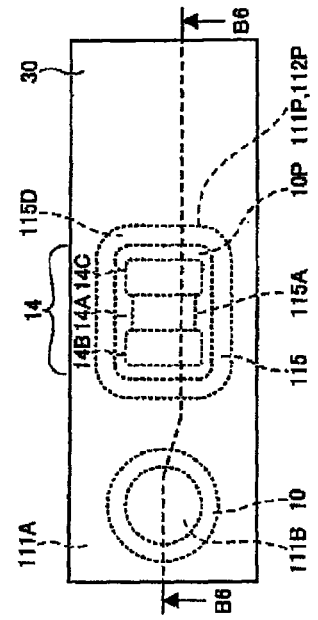
FIG. 9B2
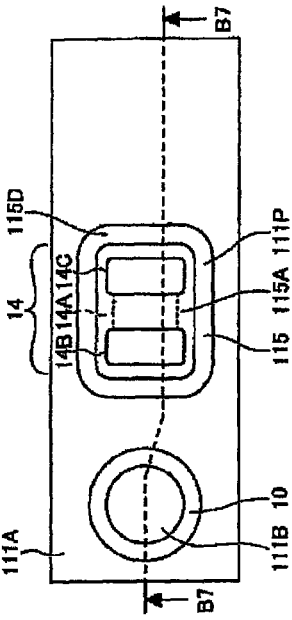
FIG. 9C2
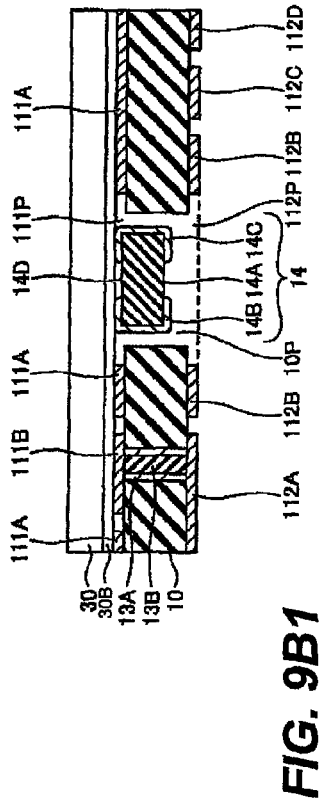
FIG. 9A1
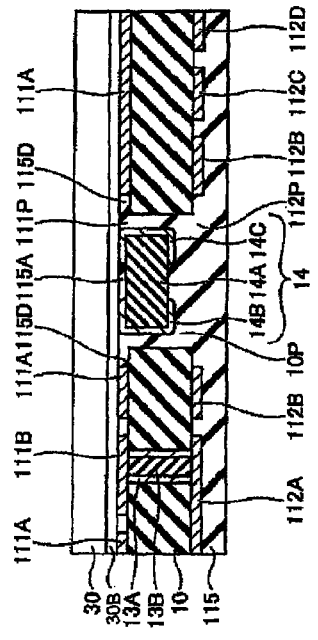
FIG. 9B1
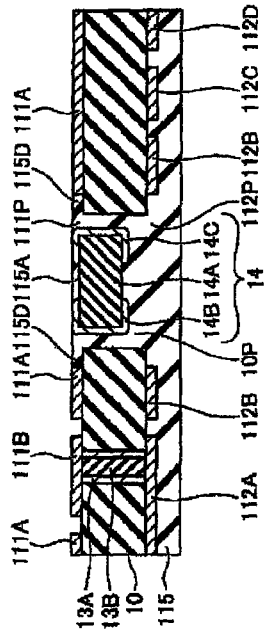
FIG. 9C1

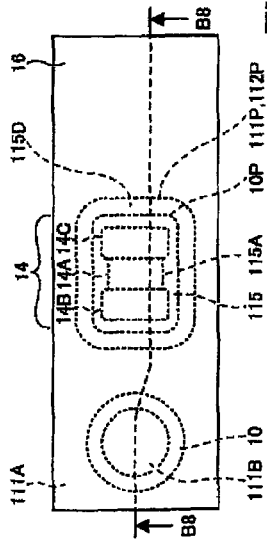
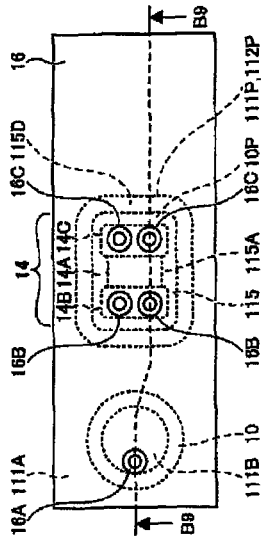
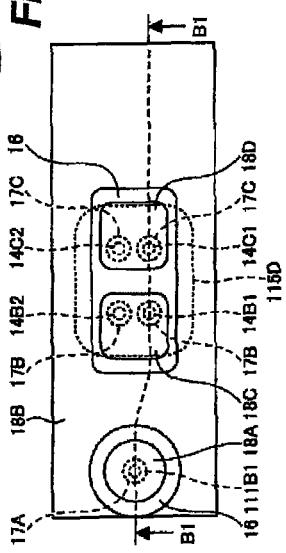
FIG. 10A2
FIG. 10B2
FIG. 10C2
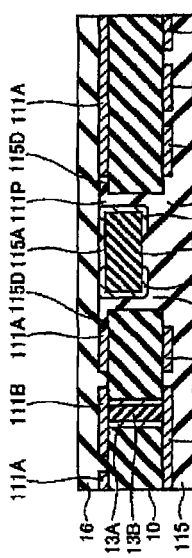
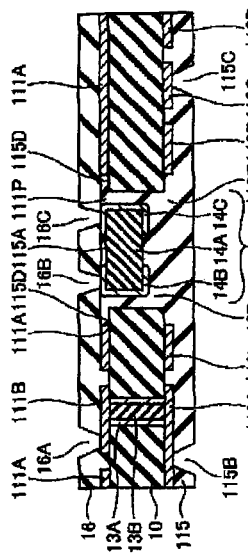
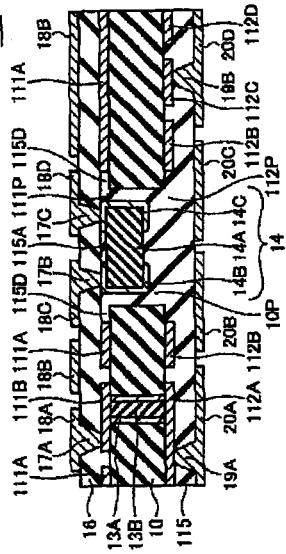
FIG. 10A1
FIG. 10B1
FIG. 10C1

WIRING BOARD

This application claims priority from Japanese Patent Application No. 2012-190381, filed on Aug. 30, 2012, the entire contents of which are herein incorporated by reference.

BACKGROUND

1. Technical Field

The present disclosure relates to a wiring board.

2. Description of the Related Art

A manufacturing method of a wiring board is known in which a filling resin is formed by filling resin paste into a gap between a ceramic sub-core and a core main body by supplying the resin paste from a first major surface side of the ceramic sub-core and the core main body by press printing using a rubber squeegee (see JP-A-2006-339482, for example).

Incidentally, the ceramic sub-core is fixed to the core main body by curing resin paste in a state that one open end of a sub-core housing portion formed in the core main body is closed by a sheet member and the ceramic sub-core that has been placed in the sub-core housing portion through the other open end is fastened to the sheet member.

However, when the sheet member is removed in a state that the ceramic sub-core is fixed to the core main body by a filling resin obtained by curing the resin paste, the ceramic sub-core may be kept fastened to the sheet member and come off the core main body due to insufficient strength of fixing by the filling resin.

This problem may occur in a case that the strength of fixing by the filling resin is weaker than the strength of fastening by the sheet member. That is, this problem may occur when the strength of holding by the filling resin is insufficient.

A similar problem due to insufficient strength of holding may also occur in a wiring board when an electronic component such as a chip capacitor, instead of a ceramic sub-core, is fixed by a filling resin in an opening that is formed in the core main body.

SUMMARY OF THE INVENTION

One or more aspects of the present invention are to provide a wiring board, which can increase the strength of holding an electronic component.

According to one or more aspects of the present invention, there is provided a wiring board. The wiring board comprises: a core layer having a through hole therethrough and comprising a first surface and a second surface opposite to the first surface; a first wiring layer formed on the first surface of the core layer and having a first opening which is communicated with the through hole, wherein an opening area of the first opening is larger than that of the through hole in a plan view, an electronic component disposed in the through hole and the first opening and comprising: a first surface; a second surface opposite to the first surface; and a side surface between the first surface and the second surface, the electronic component further comprising a pair of terminals on the first surface thereof, wherein the first surface of the electronic component is located on a side of the first surface of the core layer and the second surface of the electronic component is located on a side of the second surface of the core layer; and a first resin layer filled in the through hole, the first opening and a gap between the pair of terminals so as to cover the second surface and the side surface of the electronic component.

BRIEF DESCRIPTION OF THE DRAWINGS

FIGS. 2A1-2C2 illustrate a manufacturing process of the wiring board 50 of Comparative Example;

FIGS. 3A1-3C2 illustrate the manufacturing process of the wiring board 50 of Comparative Example;

FIGS. 4A1-4C2 illustrate the manufacturing process of the wiring board 50 of Comparative Example;

FIGS. 8A1-8C2 illustrate a manufacturing process of the wiring board 100 according to the embodiment;

FIGS. 9A1-9C2 illustrate the manufacturing process of the wiring board 100 according to the embodiment;

FIGS. 10A1-10C2 illustrate the manufacturing process of the wiring board 100 according to the embodiment;

DETAILED DESCRIPTION

Figure 1B:
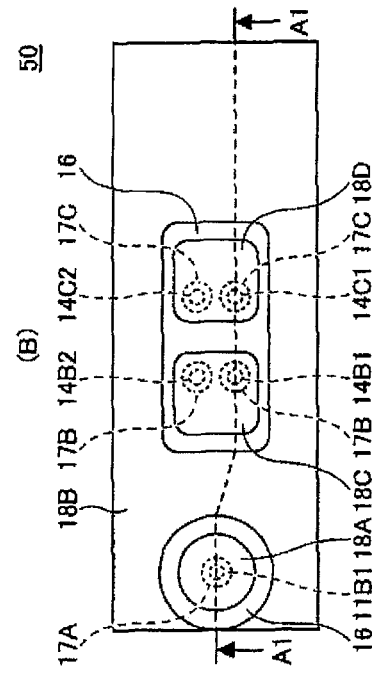
FIG. 1B is a plan view of the wiring board 50 of Comparative Example.

Exemplary embodiments of the present invention will be hereafter described with reference to the drawings. The same constituent items in the drawings are given the same reference symbol, and the redundant descriptions may be omitted.

Before description of a wiring board and a manufacturing method of a wiring board according to an embodiment of the present invention, a wiring board and a manufacturing method of a wiring board of Comparative Example will be described with reference to FIGS. 1A and 1B.

Comparative Example

Figure 1A:
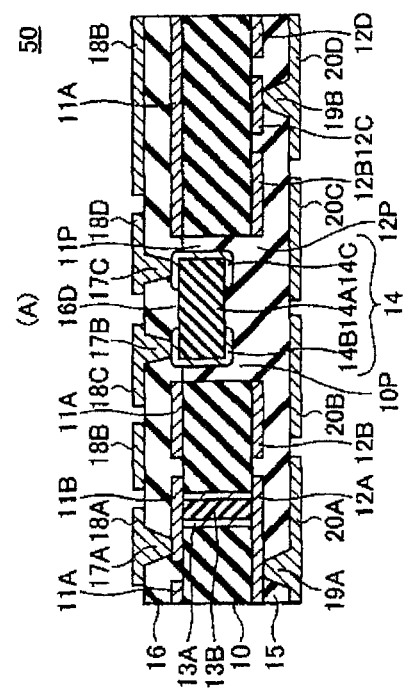
FIG. 1A is a sectional view of a wiring board 50 of Comparative Example.

FIGS. 1A and 1B show a wiring board 50 of Comparative Example. FIG. 1B is a plan view and FIG. 1A is a sectional view as viewed from the direction of arrows A1 in FIG. 1B.

As shown in FIG. 1A, the wiring board 50 of Comparative Example includes a core 10, wiring layers 11A and 11B, wiring layers 11A and 11B, wiring layers 12A-12D, a through-hole 13A, a buried resin 13B, a chip capacitor 14, and an insulating layer 15.

The wiring board 50 also includes an insulating layer 16, via electrodes 17A-17C, wiring layers 18A-18D, via electrodes 19A and 19B, and wiring layers 20A-20D.

In the following description, for the sake of convenience, surfaces drawn in each drawing on the top side and the bottom side of each member, layer, or the like will be referred to as a top surface and a bottom surface, respectively, and the terms "above," "over," "below," and "under" will be used. However, the terms "top surface," "bottom surface," "above," "over," "below," "under," "top side," and "bottom side" do not refer to a universal top-bottom relationship and merely indicate a top-bottom relationship in each drawing.

For example, the core 10 is a member produced by impregnating a glass fabric base member with an epoxy resin. Copper foils are bonded to the two respective surfaces of the core 10. The two copper foils are patterned into the wiring layers 11A and 11B and the wiring layers 12A-12D, respectively.

A though-hole 10P is formed at the center in the width direction (the horizontal direction in FIGS. 1A and 1B) of the core 10 so as to penetrate through the core 10 in its thickness direction (the vertical direction in FIG. 1A). An opening 11P and an opening 12P are formed through the respective wiring layers 11A and 12B over and under the though-hole 10P so as to be continuous with the though-hole 10P.

The wiring layers 11A and 11B are metal layers that are formed on the top surface of the core 10 by, for example, patterning the copper foil bonded to the top surface of the core 10.

The opening 11P is formed at the center in the width direction (the horizontal direction in FIGS. 1A and 1B) of the wiring layer 11A. The opening 11P is formed over the though-hole 10P so as to be continuous with the though-hole 10P. The opening 11P has the same size as the though-hole 10P in a plan view, and occupies the same area as the though-hole 10P in a plan view.

The through-hole 13A is connected to the wiring layer 11B from below, and the via electrode 17A is connected to the wiring layer 11B from above. The wiring layer 11B is connected to the wiring layer 12A by the through-hole 13A, and is connected to the wiring layer 18A by the via electrode 17A. A connection portion 11B1 between the via electrode 17A and the wiring layer 11B is shown in FIG. 1B.

The wiring layers 12A-12D are metal layers that are formed on the bottom surface of the core 10 by, for example, patterning the copper foil bonded to the bottom surface of the core 10.

The through-hole 13A is connected to the wiring layer 12A from above, and the via electrode 19A is connected to the wiring layer 12A from below. The wiring layer 12A is connected to the wiring layer 11B via the through-hole 13A, and is connected to the wiring layer 20A by the via electrode 19A.

The opening 12P is formed at the center in the width direction (the horizontal direction in FIGS. 1A and 1B) of the wiring layer 12B. The opening 12P is formed under the though-hole 10P so as to be continuous with the though-hole 10P. The opening 12P has the same size as the though-hole 10P and the opening 11P in a plan view, and occupies the same area as the though-hole 10P and the opening 11P in a plan view.

The via electrode 19B is connected to the wiring layer 12C from below, and the wiring layer 12C is connected to the wiring layer 20D by the via electrode 19B.

The through-hole 13A penetrates through the core 10 in its thickness direction and connects the top wiring layer 11B and the bottom wiring layer 12A. For example, the through-hole 13A is formed by forming a through-hole through the core 10 and forming a copper plating film on the inner wall surface of the thus-formed through-hole.

The buried resin 13B is formed by filling the inside space of the through-hole 13A with resin.

The chip capacitor 14 is a chip-shaped capacitor having a chip body 14A and terminals 14B and 14C. In the chip capacitor 14, the terminals 14B and 14C are connected to a pair of internal electrodes (not shown), respectively, and a prescribed capacitance is thereby obtained. The chip body 14A is formed by covering the pair of electrodes with resin.

Each of the terminals 14B and 14C of the chip capacitor 14 is formed on the top surface, a side surface, and the bottom surface of the chip body 14A so as to extend continuously, and the terminals 14B and 14C are insulated from each other. On the top surface of the chip body 14A, a gap (groove) is formed between the terminals 14B and 14C and is occupied by an insulating layer 16D.

Two via electrodes 17B are connected to the terminal 14B from above, and two via electrodes 17C are connected to the terminal 14C from above. Connection portions 14B1 and 14B2 between the terminal 14B and the two via electrodes 17B are shown in FIG. 1B. Connection portions 14C1 and 14C2 between the terminal 14C and the two via electrodes 17C are also shown in FIG. 1B. FIG. 1A is a sectional view that is taken by a plane passing through one of the two via electrodes 17B and one of the two via electrodes 17C and that is as viewed from the direction of arrows A1 in FIG. 1B.

The outlines of the via electrodes 17B and 17C shown in FIG. 1B are those of the top surfaces of the via electrodes 17B and 17C each having a truncated cone shape. The outlines of the connection portions 14B1, 14B2, 14C1, and 14C2 shown in FIG. 1B are those of the bottom surfaces of the via electrodes 17B and 17C.

The insulating layer 15 is formed so as to cover the bottom surfaces of the wiring layers 12A-12D which are formed on the bottom surface of the core 10, and to fill the inside spaces of the though-hole 10P and the openings 11P and 12P.

The insulating layer 15 is formed by filling the inside spaces of the though-hole 10P and the openings 11P and 12P and covering the bottom surfaces of the wiring layers 12A-12D with heat-melted resin. For example, the insulating layer 15 is formed by thermally curing an epoxy, polyimide, or like resin material by heating and pressurizing it.

Via holes which are to be filled with the respective via electrodes 19A and 19B are formed through the insulating layer 15.

The insulating layer 15 may be made of a filling resin material for a build-up board.

The insulating layer 16 is formed on the core 10, the wiring layers 11A and 11B, and the chip capacitor 14. For example, the insulating layer 16 may be made of the same resin material as the insulating layer 15 (epoxy, polyimide, or like resin material).

Each of the insulating layers 15 and 16 may be a prepreg which is in what is called a B-stage (half-set state), for example. An example of the prepreg is a one produced by impregnating a woven or non-woven fabric of glass fiber, carbon fiber, or the like with an epoxy, polyimide, or like insulative resin which is preferably a thermosetting resin.

Via holes which are to be filled with the respective via electrodes 17A-17C are formed through the insulating layer 16.

A part (insulating layer 16A) of the insulating layer 16 is formed on the top surface of the chip body 14A of the chip capacitor 14 in the groove (gap) formed between the terminals 14B and 14C.

The via electrodes 17A-17C are formed in the respective via holes that are formed through the insulating layer 16, and the via electrode 17A, the via electrodes 17B, and the via electrodes 17C are connected to the wiring layer 11B and the terminals 14B and 14C, respectively. The wiring layers 18A, 18C, and 18D are connected to the via electrode 17A, the via electrodes 17B, and the via electrodes 17C, respectively. The via electrodes 17A-17C are copper plating films, for example.

The wiring layers 18A-18D are formed on the top surface of the insulating layer 16. Among the wiring layers 18A-18D, the wiring layers 18A, 18C, and 18D are connected to the via electrode 17A, the via electrodes 17B, and the via electrodes 17C, respectively. The wiring layers 18A-18D are copper plating films, for example.

The wiring layers 18C and 18D are connected to the terminals 14B and 14C of the chip capacitor 14. Therefore, the wiring layers 18C and 18D are connected to the pair of internal electrodes that are incorporated in the chip body 14A of the chip capacitor 14, and are used as interconnections or terminals for charge/discharge of the chip capacitor 14.

The via electrodes 19A and 19B are formed in the respective via holes that are formed through the insulating layer 15, and are connected to the respective wiring layers 12A and 12C. The wiring layers 20A and 20D are connected to the bottom surfaces of the via electrodes 19A and 19B, respectively. The via electrodes 19A and 19B are copper plating films, for example.

The wiring layers 20A-20D are formed on the bottom surface of the insulating layer 15. Among the wiring layers 20A-20D, the wiring layers 20A and 20D are connected to the respective via electrodes 19A and 19B. The wiring layers 20A-20D are copper plating films, for example.

The above-described wiring board 50 of Comparative Example is what is called a build-up board in which the chip capacitor 14 is incorporated in the core 10.

Next, a manufacturing method of the wiring board 50 of Comparative Example will be described.

FIGS. 2A1-2C2 to FIGS. 4A1-4C2 illustrate a manufacturing process of the wiring board 50 of Comparative Example.

First, as shown in FIGS. 2A1 and 2A2, a through-hole 13A having a copper plating film is formed through a core 10 and the inside space of the through-hole 13A is filled with a buried resin 13B. Wiring layers 11 and 12 are bonded to the top surface and the bottom surface of the core 10, respectively. In this example, the wiring layers 11 and 12 are copper foils.

Then, as shown in FIGS. 2B1 and 2B2, a through-hole 10P and openings 11P and 12P are formed through the core 10 and the wiring layers 11 and 12, respectively. The through-hole 10P and the openings 11P and 12P, which penetrate through the core 10 and the wiring layers 11 and 12, respectively, can be formed simultaneously by one piece of processing using a router or a die press machine. Therefore, the through-hole 10P and the openings 11P and 12P have the same size and occupy the same area in a plan view.

Then, as shown in FIGS. 2C1 and 2C2, the wiring layers 11 and 12 are patterned into wiring layers 11A and 11B and wiring layers 12A-12D, respectively. As shown in FIG. 2C2, the wiring layer 11B is circular in a plan view. The bottom surface of the wiring layer 11B is connected to the through-hole 13A.

Then, as shown in FIGS. 3A1 and 3A2, a temporary bonding tape 30 is bonded to the wiring layers 11A and 11B. The bottom surface of the temporary bonding tape 30 is formed with an adhesive layer 30A. Then, a chip capacitor 14 is inserted into the through-hole 10P and the opening 11P through the opening 12P which is located on the bottom surface side of the core 10, and is bonded to the bottom surface of the temporary bonding tape 30. The adhesive layer 30A is thicker than the wiring layers 11A and 11B and the terminals 14B and 14C.

In this state, the top surfaces of the terminals 14B and 14C of the chip capacitor 14 are flush with the top surfaces of the wiring layers 11A and 11B. The wiring layers 11A and 11B and the terminals 14B and 14C are buried in the adhesive layer 30A in a depth that is equal to about a half of the thickness of the adhesive layer 30A. Over the top surface of the chip body 14A, a groove (gap) 14D is formed between the terminals 14B and 14C and is filled with part of the adhesive layer 30A.

Then, as shown in FIGS. 3B1 and 3B2, resin material such as an epoxy, polyimide or the like is supplied to the inside spaces of the through-hole 10P and the openings 11P and 12P and the bottom surfaces of the wiring layers 12A-12D, and is heated and pressurized. As a result, resin material such as the epoxy, polyimide or the like is thermally cured and turns to an insulting layer 15.

The through-hole 10P and the openings 11P and 12P are filled with the insulting layer 15.

Then, as shown in FIGS. 3C1 and 3C2, the temporary bonding tape 30 is removed, whereby as shown in FIG. 3C2 the wiring layers 11A and 11B, a part of the core 10 (the portion between the wiring layers 11A and 11B), a part of the insulating layer 15 (the portion around the chip capacitor 14), and a part of the chip capacitor 14 (the groove 14D between the terminals 14B and 14C) are exposed.

Then, as shown in FIGS. 4A1 and 4A2, an insulating layer 16 is formed by bonding resin material such as an epoxy, polyimide or the like to the wiring layers 11A and 11B, the part of the core 10 (the portion between the wiring layers 11A and 11B), the part of the insulating layer 15 (the portion around the chip capacitor 14), and the part of the chip capacitor 14 (the groove 14D between the terminals 14B and 14C). An insulating layer 16D which is part of the insulating layer 16 is formed in the groove 14D. The insulating layer 16 is also formed between the wiring layer 11A and the terminals 14B and 14C of the chip capacitor 14 (in the opening 11P in a depth that is approximately equal to the thickness of the wiring layer 11A).

The insulating layer 16 is formed by heating and pressurizing resin material such as epoxy, polyimide or the like.

Then, as shown in FIGS. 4B1 and 4B2, via holes 16A-16C are formed through the insulating layer 16 and via holes 15B and 15C are formed through the insulating layer 15.

The via holes 15B and 15C and 16A-16C may be formed by laser processing, for example.

Then, as shown in FIGS. 4C1 and 4C2, via electrodes 17A-17C, wiring layers 18A-18D, via electrodes 19A and 19B, and wiring layers 20A-20D are formed. This may be done by forming copper plating films by plating, more specifically, by, for example, a semi-additive method.

The via electrode 17A, the via electrodes 17B, and the via electrodes 17C are formed in the via hole 16A, the via holes 16B, the via holes 16C, respectively, by a semi-additive method. The wiring layers 18A-18D are formed continuously with the plating for forming the via electrodes 17A-17C.

The via electrodes 19A and 19B are formed in the respective via holes 15B and 15C by a semi-additive method. The wiring layers 20A-20D are formed continuously with the plating for forming the via electrodes 19A and 19B.

A wiring board 50 of Comparative Example is thus completed.

Incidentally, in the manufacturing method of the wiring board 50 of Comparative Example, the following problem arises in the transition from the state of FIG. 3B1 to the state of FIG. 3C1. This problem will be described below with reference to FIGS. 5A and 5B.

Figure 5A:
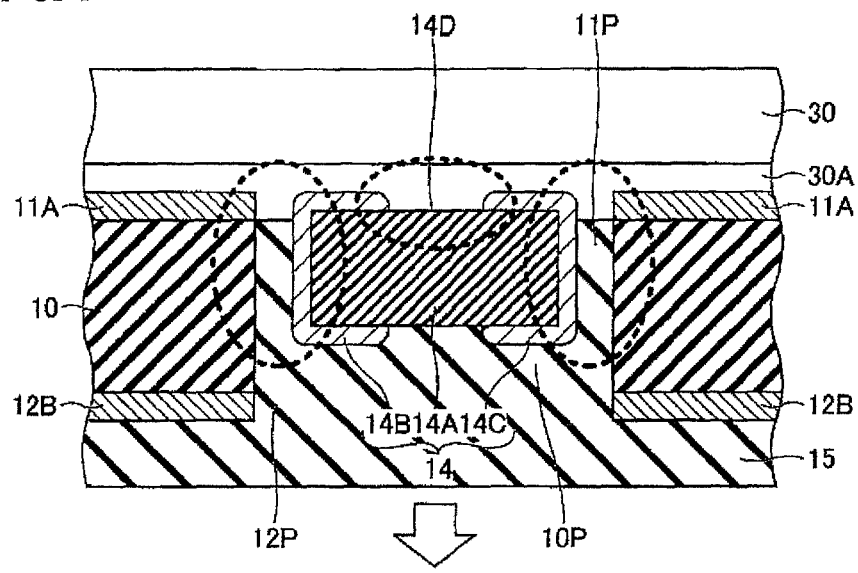
FIGS. 5A and 5B illustrate a problem of the manufacturing method of the wiring board 50 of Comparative Example.
Figure 5B:
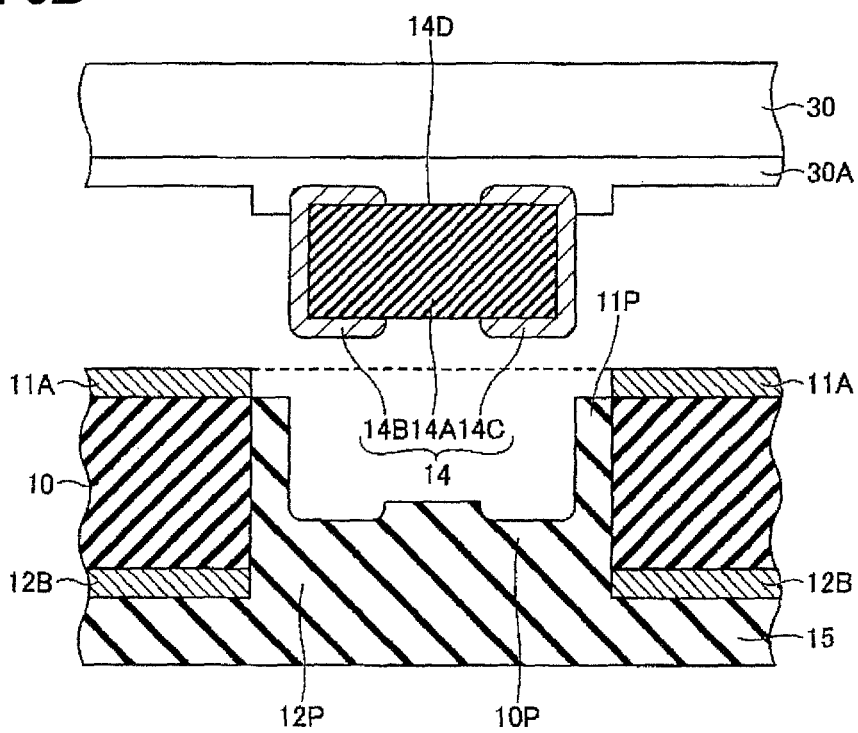

FIGS. 5A and 5B illustrate a problem of the manufacturing method of the wiring board 50 of Comparative Example.

FIG. 5A is an enlarged sectional view of the chip capacitor 14 and its neighborhood shown in FIG. 3B1.

The temporary bonding tape 30 is peeled off the surfaces of the wiring layers 11A and 11B in the state that as shown in FIG. 5A the chip capacitor 14 is bonded to the temporary bonding tape 30 and the opening 11P, the through-hole 10P, and the opening 12P are sealed by the insulating layer 15.

In this state, the top surface of the chip capacitor 14 is bonded to the adhesive layer 30A and its side surfaces are held by that part of the insulating layer 15 which fills the opening 11P and the through-hole 10P. That is, the chip capacitor 14 is held by the insulating layer 15 in the two side regions of the three regions indicated by broken-line ellipses in FIG. 5A and is bonded to the adhesive layer 30A in the other, central region.

When the temporary bonding tape 30 is peeled off the surfaces of the wiring layers 11A and 11B in this state, the following problem arises if the adhesion between the adhesive layer 30A and the chip capacitor 14 exceeds the strength of holding the chip capacitor 14 by the insulating layer 15.

As shown in FIG. 5B, the chip capacitor 14 may come off the insulating layer 15 being kept held by (bonded to) the temporary bonding tape 30 instead of being kept held by the insulating layer 15. This results from the fact that the adhesion between the adhesive layer 30A and the chip capacitor 14 exceeds the strength of holding the chip capacitor 14 by the insulating layer 15.

A part of the insulating layer 15 which fills the through-hole 10P holds the side surfaces of the chip capacitor 14. Since the opening 11P has the same size as the though-hole 10P, the strength for the insulating layer to hold the chip capacitor 14 may be insufficient near the opening 11P.

Therefore, the chip capacitor 14 may come off the insulating layer 15 as shown in FIG. 5B when the temporary bonding tape 30 is removed, if the strength of holding of the chip capacitor 14 by the insulating layer 15 is weaker than the adhesion between the adhesive layer 30A and the chip capacitor 14.

If the chip capacitor 14 comes off the insulating layer 15, a resulting wiring board 50 is unusable, that is, defective. As such, in the wiring board 50 of Comparative Example, a defective product may be manufactured through the above-described manufacturing process.

The same problem may also arise in the case where another kind of electronic component such as a semiconductor device is used instead of the chip capacitor 14.

In summary, the wiring board 50 of Comparative Example has the problem that the strength of holding of an electronic component may be insufficient.

The wiring board 50 of Comparative Example has another problem that electric connection trouble may occur if the position of the chip capacitor 14 in the opening 11P and the through-hole 10P is deviated. This problem will be described below with reference to FIG. 6.

Figure 6:
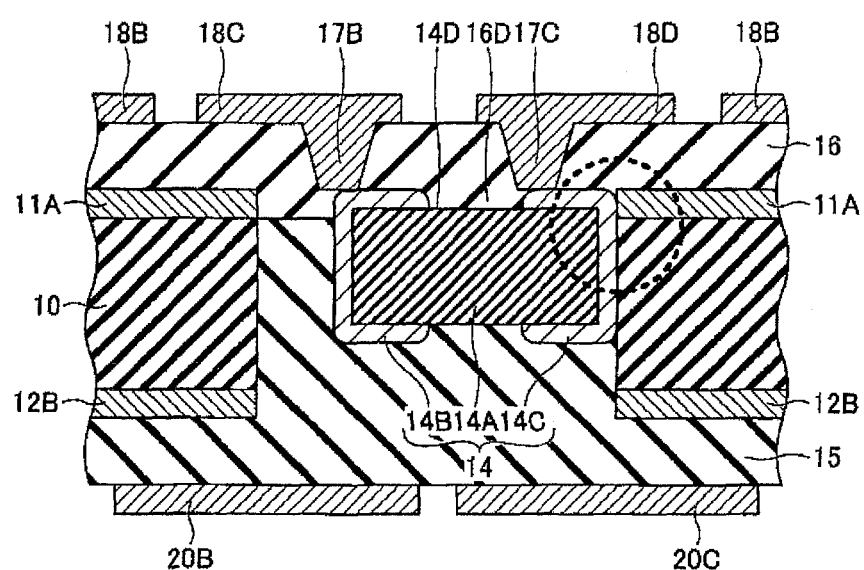
FIG. 6 illustrates another problem of the manufacturing method of the wiring board 50 of Comparative Example.

FIG. 6 shows another problem of the manufacturing process of the wiring board 50 of Comparative Example.

FIG. 6 is an enlarged sectional view, in the manufacturing step of FIG. 4C1, of the chip capacitor 14 and its neighborhood which may cause electric connection trouble.

In this example, the problem shown in FIG. 5B has not occurred, that is, the temporary bonding tape 30 has been removed correctly and the chip capacitor 14 is held by the insulating layer 15 in the opening 11P and the through-hole 10P.

However, in the example of FIG. 6, the chip capacitor 14 is deviated rightward from its position shown in FIG. 4C1 and the terminal 14C is in contact with the wiring layer 11A as shown in a broken-line circle. The terminal 14C should only be connected to the via electrodes 17C (see FIG. 4C1) and should not be connected to the wiring layer 11A.

If the position of the chip capacitor 14 is deviated and the terminal 14C is connected to wiring layer 11A, the chip capacitor 14 cannot be charged or discharged correctly, resulting in a problem that the reliability of the wiring board 50 is lowered.

As described above, the wiring board 50 of Comparative Example has the problems that the strength of holding of an electronic component may be insufficient and that its reliability is lowered.

An object of the embodiment described below is therefore to provide a wiring board that is increased in the strength of holding of an electronic component as well as in reliability.

Embodiment

Figure 7B:
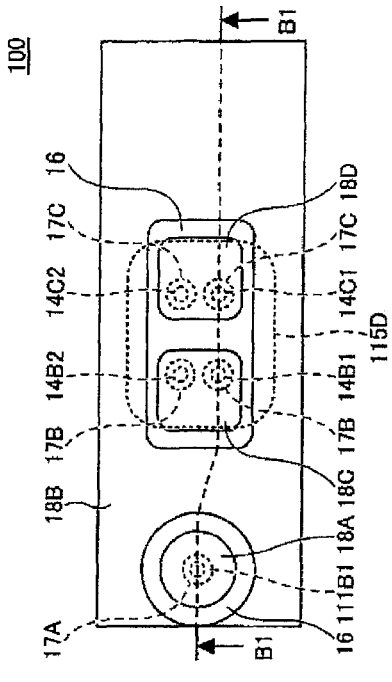
FIGS. 7A-7D are sectional views and a plan view of a wiring board 100 according to an embodiment.
Figure 7D:
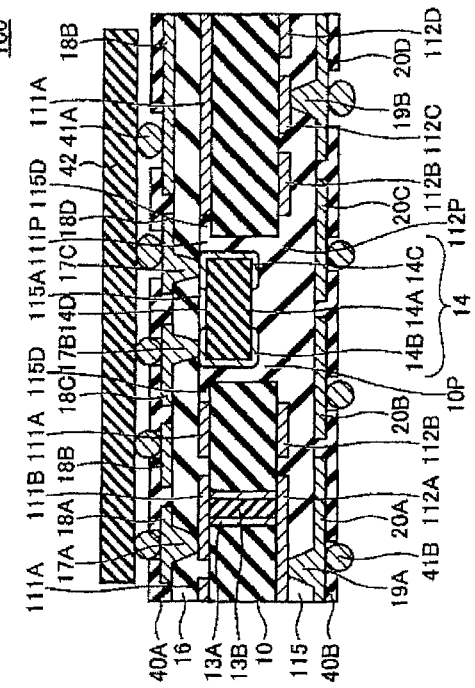
Figure 7A:
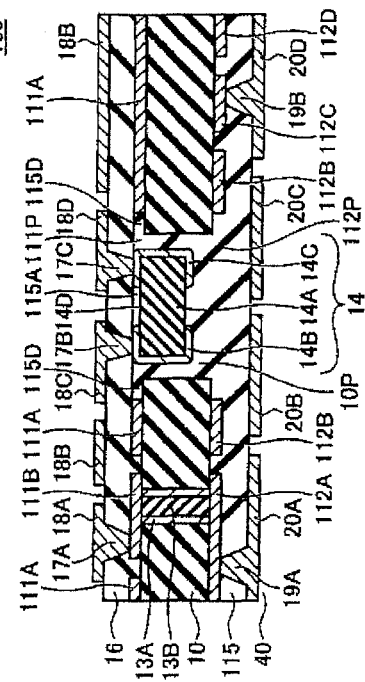
Figure 7C:
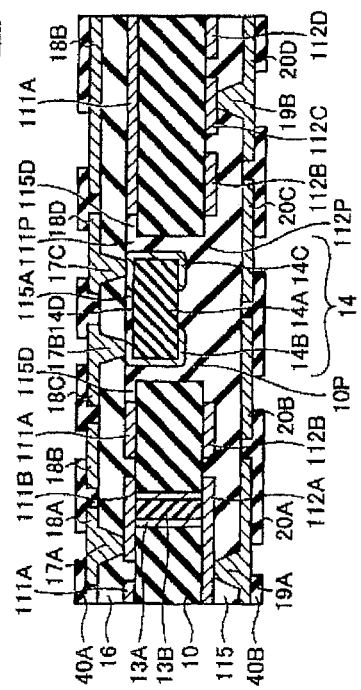

FIGS. 7A-7D are sectional views and a plan view of a wiring board 100 according to the embodiment. FIG. 7B is a plan view and FIG. 7A is a sectional view as viewed from the direction of arrows B1 in FIG. 7B. FIG. 7C is a sectional view of a structure which is obtained by adding solder resist layers 40A and 40B to the structure of FIG. 7A. FIG. 7D is a sectional view of a structure which is obtained by adding an LSI (large scale integrated circuit) chip 42 to the structure of FIG. 7C.

The wiring board 100 according to the embodiment is different from the wiring board 50 of Comparative Example in that an opening 111P of a wiring layer 111A which corresponds to the wiring layer 11A of the wiring board 50 of Comparative Example is larger than and includes the top open end of a though-hole 10P of a core 10 in a plan view.

Likewise, an opening 112P of a wiring layer 112B which corresponds to the wiring layer 12B of the wiring board 50 of Comparative Example is larger than and includes the bottom open end of the though-hole 10P of the core 10 in a plan view.

The other constituent elements of the wiring board 100 are the same as the corresponding ones of the wiring board 50 of Comparative Example, and hence are given the same reference symbols as the latter and will not be described in detail.

The wiring board 100 includes a core 10, wiring layers 111A and 111B, wiring layers 111A and 111B, wiring layers 112A-112D, a through-hole 13A, a buried resin 13B, a chip capacitor 14, and an insulating layer 15.

The wiring board 100 also includes an insulating layer 16, via electrodes 17A-17C, wiring layers 18A-18D, via electrodes 19A and 19B, and wiring layers 20A-20D.

In the following description, for the sake of convenience, surfaces drawn in each drawing on the top side and the bottom side of each member, layer, or the like will be referred to as a top surface and a bottom surface, respectively, and the terms "above," "over," "below," and "under" will be used. However, the terms "top surface," "bottom surface," "above," "over," "below," "under," "top side," and "bottom side" do not refer to a universal top-bottom relationship and merely indicate a top-bottom relationship in each drawing.

For example, the core 10 is a member produced by impregnating a glass fabric base member with an epoxy resin. Copper foils are bonded to the two respective surfaces of the core 10. The two copper foils are patterned into the wiring layers 111A and 111B and the wiring layers 112A-112D, respectively.

The core 10 is an example of a core layer. The wiring layers 111A and 111B are examples of a first wiring layer. The wiring layers 112A-112D are examples of a second wiring layer.

An opening 111P is formed through the wiring layer 111A so as to be located over the though-hole 10P. An opening 112P is formed through the wiring layer 112B so as to be located under the though-hole 10P.

The opening 111P is larger than the top open end of the though-hole 10P. The opening 111P includes the top open end of the though-hole 10P of the core 10 in a plan view. The opening 111P is an example of a first opening.

The opening 112P is larger than the bottom open end of the though-hole 10P of the core 10. The opening 112P includes the bottom open end of the though-hole 10P of the core 10 in a plan view. The opening 112P is an example of a second opening.

The wiring layers 111A and 111B are metal layers that are formed on the top surface of the core 10 by, for example, patterning the copper foil bonded to the top surface of the core 10.

Between the wiring layers 111A and 111B, the wiring layer 111B is the same as the wiring layer 11B of the wiring board 50 of Comparative Example.

The opening 111P is formed at the center in the width direction (the horizontal direction in FIGS. 7A-7D) of the wiring layer 111A. As described above, the opening 111P is larger than and includes the top open end of the though-hole 10P of the core 10 in a plan view. That is, the opening 111P includes the though-hole 10P in a plan view.

The through-hole 13A is connected to the wiring layer 111B from below, and the via electrode 17A is connected to the wiring layer 111B from above. The wiring layer 111B is connected to the wiring layer 112A by the through-hole 13A, and is connected to the wiring layer 18A by the via electrode 17A. A connection portion 111B1 between the via electrode 17A and the wiring layer 111B is shown in FIG. 7B. The difference between the sizes of the opening 111P and the though-hole 10P will be described later in a description of a manufacturing process.

The wiring layers 112A-112D are metal layers that are formed on the bottom surface of the core 10 by, for example, patterning the copper foil bonded to the bottom surface of the core 10.

Among the wiring layers 112A-112D, the wiring layers 112A, 112C, and 112D are the same as the wiring layers 12A, 12C, and 12D of the wiring board 50 of Comparative Example.

The wiring later 112A is connected to the wiring layer 111B by the through-hole 13A, and is connected to the wiring layer 20A by the via electrode 19A.

The opening 112P is formed at the center in the width direction (the horizontal direction in FIGS. 7A-7D) of the wiring layer 112B. The opening 112P is formed under the though-hole 10P. The opening 112P is larger than and includes the bottom open end of the though-hole 10P in a plan view.

The via electrode 19B is connected to the wiring layer 112C from below, and the wiring layer 112C is connected to the wiring layer 20D by the via electrode 19B.

The through-hole 13A penetrates through the core 10 in its thickness direction and connects the top wiring layer 111B and the bottom wiring layer 112A.

The insulating layer 115 is formed so as to cover the bottom surfaces of the wiring layers 112A-112D which are formed on the bottom surface of the core 10, and to fill the inside spaces of the though-hole 10P and the openings 111P and 112P.

The insulating layer 115 is formed by filling the inside spaces of the though-hole 10P and the openings 111P and 112P and covering the bottom surfaces of the wiring layers 112A-112D with heat-melted resin. For example, the insulating layer 115 is formed by thermally curing an epoxy, polyimide, or like resin material by heating and pressurizing it.

Part (insulating layer 115A) of the insulating layer 115 is formed on the top surface of the chip body 14A of the chip capacitor 14 in a groove (gap) 14D formed between the terminals 14B and 14C. The top surface of the chip capacitor 14 is an example of a first surface, and the bottom surface of the chip capacitor 14 is an example of a second surface.

In the embodiment, the opening 111P is larger than and includes the though-hole 10P in a plan view. Therefore, part (extension 115D) of the insulating layer 115 extends outward alongside the outer periphery of the opening 111P so as to be shaped like a rectangular ring in a plan view. The extension 115D is located outside the top open end of the though-hole 10P in a plan view. The insulating layers 115 and 115A and the extension 115D are examples of a first resin layer.

Via holes which are to be filled with the respective via electrodes 19A and 19B are formed through the insulating layer 115.

The insulating layer 16 is formed on the core 10, the wiring layers 111A and 111B, and the chip capacitor 14. For example, the insulating layer 16 may be made of an epoxy, polyimide, or like resin material. The insulating layer 16 is an example of a second resin layer. The insulating layer 16 (an example of the second resin layer) is made of a different resin than the insulating layer 115 (an example of the first resin layer).

The insulating layer 16 may be a prepreg which is in what is called a B-stage (half-set state), for example. An example of the prepreg is produced by impregnating a woven or non-woven fabric such as glass fiber, carbon fiber or the like with insulating resin such as an epoxy, polyimide or the like which is preferably a thermosetting resin. The insulating layer 16 need not always contain a woven or non-woven fabric such as glass fiber, carbon fiber or the like.

Via holes which are to be filled with the respective via electrodes 17A-17C are formed through the insulating layer 16.

The via electrodes 17A-17C are formed in the respective via holes that are formed through the insulating layer 16, and the via electrode 17A, the via electrodes 17B, and the via electrodes 17C are connected to the wiring layer 111B and the terminals 14B and 14C, respectively. The wiring layers 18A, 18C, and 18D are connected to the via electrode 17A, the via electrodes 17B, and the via electrodes 17C, respectively. The via electrodes 17A-17C are copper plating films, for example.

The via electrodes 19A and 19B are formed in the respective via holes that are formed through the insulating layer 115, and are connected to the respective wiring layers 112A and 112C. The wiring layers 20A and 20D are connected to the bottom surfaces of the via electrodes 19A and 19B, respectively. The via electrodes 19A and 19B are copper plating films, for example.

The wiring layers 20A-20D are formed on the bottom surface of the insulating layer 115. Among the wiring layers 20A-20D, the wiring layers 20A and 20D are connected to the respective via electrodes 19A and 19B. The wiring layers 20A-20D are copper plating films, for example.

The above-described wiring board 100 according to the embodiment is what is called a build-up board in which the chip capacitor 14 is incorporated in the core 10.

As shown in FIG. 7C, the wiring board 100 may further include solder resist layers 40A and 40B which are formed on the top surfaces of the wiring layers 18A-18D and the bottom surfaces of the wiring layers 20A-20D, respectively.

The solder resist layer 40A is formed to expose portions of the top surfaces of the wiring layers 18A-18D. Those portions of the wiring layers 18A-18D which are exposed through the solder resist layer 40A are used as terminals.

The solder resist layer 40B is formed so as to expose portions of the bottom surfaces of the wiring layers 20A-20D. Those portions of the wiring layers 20A-20D which are exposed through the solder resist layer 40B are used as terminals.

As shown in FIG. 7D, an LSI chip 42 is mounted on the wiring board 100 so as to be connected, via bumps 41A, to those portions (terminals) of the wiring layers 18A-18D which are exposed through the solder resist layer 40A.

As shown in FIG. 7D, bumps 41B are connected to those portions (terminals) of the wiring layers 20A-20D which are exposed through the solder resist layer 40B.

In this manner, the LSI chip 42 can be mounted on the wiring board 100 according to the embodiment.

Next, a manufacturing method of the wiring board 100 according to the embodiment will be described.

FIGS. 8A1-8C2 to FIGS. 10A1-10C2 illustrate a manufacturing process of the wiring board 100 according to the embodiment.

First, as shown in FIGS. 8A1 and 8A2, a through-hole 13A having a copper plating film is formed through a core 10 and the inside space of the through-hole 13A is filled with a buried resin 13B. Wiring layers 111 and 112 are bonded to the top surface and the bottom surface of the core 10, respectively. In this example, the wiring layers 111 and 112 are copper foils.

Then, as shown in FIGS. 8B1 and 8B2, the wiring layers 111 and 112 are patterned into wiring layers 111A and 111B and wiring layers 112A-112D, respectively.

At this time, openings 111P and 112P are formed through the respective wiring layers 111 and 112. The openings 111P and 112P have the same size and occupy the same area in a plan view.

As shown in FIG. 8B2, the wiring layer 111B is circular in a plan view. The bottom surface of the wiring layer 111B is connected to the through-hole 13A.

The wiring layers 111A and 111B, the wiring layers 112A-112D, and the openings 111P and 112P are formed by patterning by wet-etching the wiring layers 111 and 112 using photoresist layers.

Then, as shown in FIGS. 8C1 and 8C2, a through-hole 10P is formed through the core 10. The through-hole 10P, which penetrate through the core 10 in its thickness direction, can be formed using a router or a die press machine.

The through-hole 10P is smaller than and is included in each of the openings 111P and 112P in a plan view. The through-hole 10P and the openings 111P and 112P are examples of cavities.

Then, as shown in FIGS. 9A1 and 9A2, a temporary bonding tape 30 is bonded to the wiring layers 111A and 111B. The bottom surface of the temporary bonding tape 30 is formed with an adhesive layer 30B. The temporary bonding tape 30 is an example of a tape member. The adhesive layer 30B is thinner than the adhesive layer 30A which is used in Comparative Example. The adhesive layer 30B is formed by applying adhesive to the bottom surface of the temporary bonding tape 30 by such an amount that the adhesive does not flow into the groove 14D of a chip capacitor 14 even when the adhesive is pressed in the thickness direction at the time of bonding of the chip capacitor 14 to the bottom surface of the temporary bonding tape 30. For example, the adhesive layer 30B is thinner than any of the wiring layers 111A and 111B and the terminals 14B and 14C. For example, the thickness of the adhesive layer 30B may be about a half of the adhesive layer 30A which is used in Comparative Example.

After bonding the temporary bonding tape 30 to the wiring layers 111A and 111B, the chip capacitor 14 is inserted into the through-hole 10P and the opening 111P through the opening 112P which is located on the bottom surface side of the core 10, and is bonded to the bottom surface of the temporary bonding tape 30.

In this state, the top surfaces of the terminals 14B and 14C of the chip capacitor 14 are flush with the top surfaces of the wiring layers 111A and 111B. Over the top surface of the chip body 14A, the groove (gap) 14D is formed between the terminals 14B and 14C. The groove 14D is an example of a first groove. In the state of FIGS. 9A1 and 9A2, no part of the adhesive layer 30B has flown into the groove 14D and nothing is formed in the groove 14D, that is, the groove 14D is a cavity.

Then, as shown in FIGS. 9B1 and 9B2, an epoxy, polyimide, or like resin material is supplied to the inside spaces of the through-hole 10P and the openings 11P and 12P and the bottom surfaces of the wiring layers 12A-12D, and is heated and pressurized. As a result, the epoxy, polyimide, or like resin material is set thermally and turns to an insulting layer 115.

The through-hole 10P and the openings 111P and 112P are filled with the insulting layer 115, and the groove 14D (see FIG. 9A1) which is located over the top surface of the chip body 14A is filled with an insulating layer 115A.

An epoxy, polyimide, or like resin material is charged into the groove 14D by pressurization, whereby the insulating layer 115A is formed. The insulating layer 115A is formed like a bridge on the top surface of the chip body 14A between the terminals 14B and 14C.

In the embodiment, the opening 111P is larger than and includes the through-hole 10P in a plan view. Therefore, an extension 115D which is a part of the insulating layer 115 extends outward alongside the outer periphery of the opening 111P so as to be shaped like a rectangular ring in a plan view. The extension 115D is located outside the top open end of the though-hole 10P in a plan view.

In the step shown in FIGS. 9B1 and 9B2, the though-hole 10P and the openings 111P and 112P are closed by the core 10 and the wiring layers 111A and 112B in a plan view, respectively, and are closed by the temporary bonding tape 30 above. Therefore, no resin material such as the epoxy, polyimide or the like leaks to the top surfaces of the wiring layers 111A and 112B.

Then, as shown in FIGS. 9C1 and 9C2, the temporary bonding tape 30 is removed, whereby as shown in FIG. 9C2 the wiring layers 111A and 111B, part of the core 10 (the portion between the wiring layers 111A and 111B), part of the insulating layer 115 (the portion around the chip capacitor 14), the insulating layer 115A, and the extension 115D are exposed.

Then, as shown in FIGS. 10A1 and 10A2, an insulating layer 16 is formed by bonding an epoxy, polyimide, or like resin material to the wiring layers 111A and 111B, the part of the core 10 (the portion between the wiring layers 111A and 111B), the part of the insulating layer 115 (the portion around the chip capacitor 14), the insulating layer 115A, and the extension 115D.

The insulating layer 16 is formed by heating and pressurizing resin material such as the epoxy, polyimide or the like.

Then, as shown in FIGS. 10B1 and 10B2, via holes 16A-16C are formed through the insulating layer 16 and via holes 115B and 115C are formed through the insulating layer 115.

The via holes 115B and 115C and 16A-16C may be formed by laser processing, for example.

Then, as shown in FIGS. 10C1 and 10C2, via electrodes 17A-17C, wiring layers 18A-18D, via electrodes 19A and 19B, and wiring layers 20A-20D are formed. This may be done by forming copper plating films by plating, more specifically, by, for example, a semi-additive method.

The via electrode 17A, the via electrodes 17B, and the via electrodes 17C are formed in the via hole 16A, the via holes 16B, the via holes 16C, respectively, by a semi-additive method. The wiring layers 18A-18D are formed continuously with the plating for forming the via electrodes 17A-17C.

The via electrodes 19A and 19B are formed in the respective via holes 115B and 115C by a semi-additive method. The wiring layers 20A-20D are formed continuously with the plating for forming the via electrodes 19A and 19B.

A wiring board 100 according to the embodiment is thus completed.

Advantages of the wiring board 100 according to the embodiment will be described below with reference to FIGS. 11A and 11B and FIG. 12.

Figure 11A:
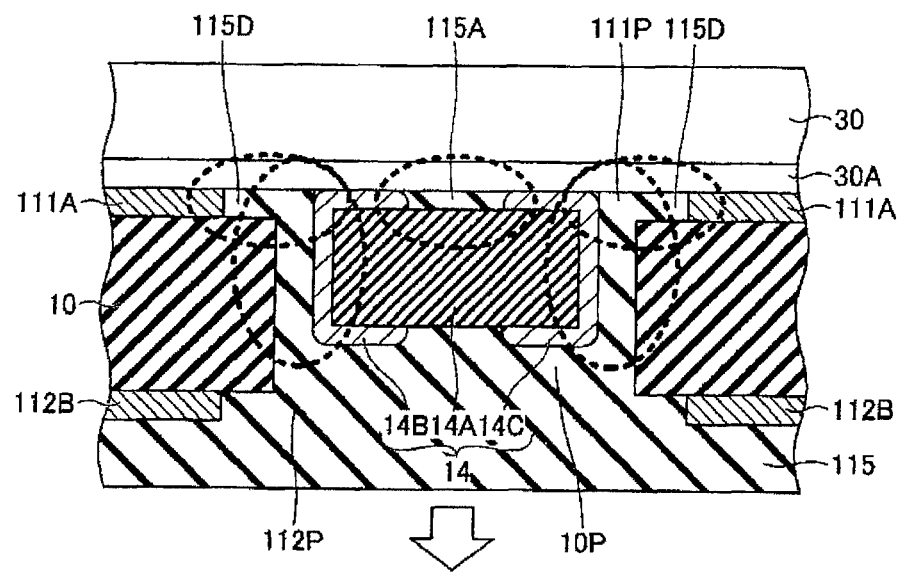
FIGS. 11A and 11B illustrate an advantage of the wiring board 100 according to the embodiment.
Figure 11B:
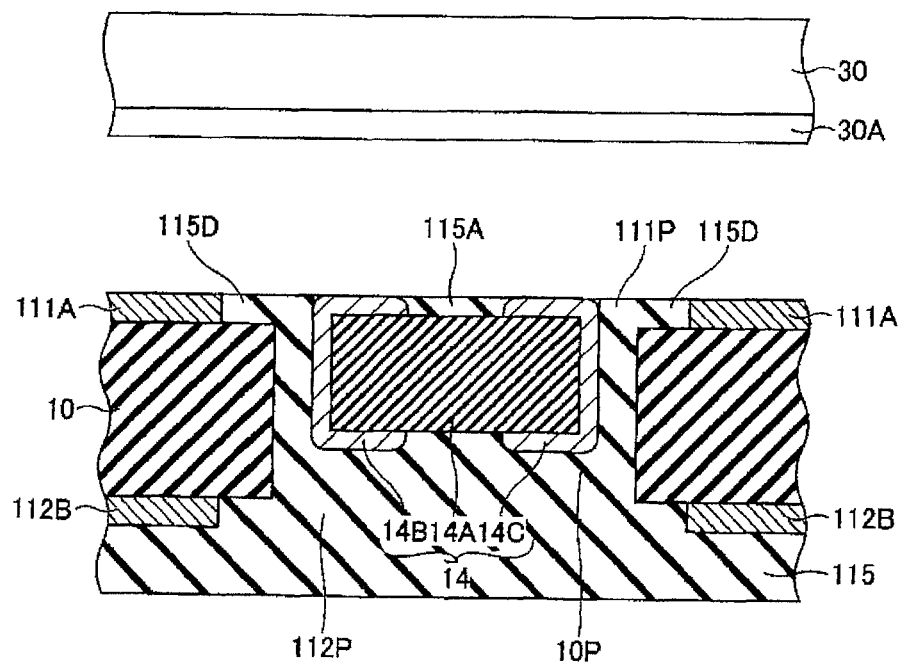

FIGS. 11A and 11B illustrate an advantage of the manufacturing method of the wiring board 100 according to the embodiment. FIG. 11A is an enlarged sectional view of the chip capacitor 14 and its neighborhood shown in FIG. 9B1. FIG. 11B shows a state that the temporary bonding tape 30 has been peeled off.

The temporary bonding tape 30 is peeled off the surfaces of the wiring layers 111A and 111B in the state that as shown in FIG. 11A the chip capacitor 14 is bonded to the temporary bonding tape 30 and the opening 111P, the through-hole 10P, and the opening 112P are sealed by the insulating layer 115.

In this state, the top surface of the chip capacitor 14 is held by the insulating layer 115A and its side surfaces are held by the insulating layer 115 which fills the opening 111P and the through-hole 10P.

The opening 111P is larger than and includes the through-hole 10P in a plan view. Therefore, the insulating layer 115 has the extension 115D in the outer periphery of the opening 111P (outside the though-hole 10P in a plan view).

That is, the chip capacitor 14 is held by the insulating layers 115 and 115A and the extension 115D in the five regions indicated by broken-line ellipses in FIG. 11A.

Because of the presence of the extension 115D which is shaped like a rectangular ring in a plan view, the side surfaces of a top portion of the chip capacitor 14 are held more strongly than in Comparative Example.

The length and the thickness of the extension 115D which extends outward from the though-hole 10P in a plan view may be set at proper values so that the strength of holding of the chip capacitor 14 by the insulating layers 115 and 115A and the extension 115D exceeds the adhesion of the temporary bonding tape 30.

Therefore, when the temporary bonding tape 30 is peeled off the surfaces of the wiring layers 111A and 111B in this state, the strength of holding of the chip capacitor 14 by the insulating layers 115 and 115A and the extension 115D is not weaker than the adhesion of the temporary bonding tape 30.

Therefore, when the temporary bonding tape 30 is peeled off in the state of FIG. 9B1, as shown in FIGS. 9C1 and 11B, only the temporary bonding tape 30 can be peeled off with the chip capacitor 14 kept held by the insulating layers 115 and 115A and the extension 115D.

That is, unlike in Comparative Example, an event that the chip capacitor 14 comes off the insulating layer 115 in a state that it is kept bonded to the temporary bonding tape 30 can be prevented. This is because the chip capacitor 14 is held by the insulating layers 115 and 115A and the extension 115D in the five regions indicated by the broken-line ellipses in FIG. 11A.

In the wiring board 100 according to the embodiment, the bridge-shaped insulating layer 115A is reinforced by reinforcing, by the extension 115D, a portion of the insulating layer 115 which exists around the side surfaces of a top portion of the chip capacitor 14.

The insulating layer 115 extends like a bridge in the groove 14D over the top surface of the chip capacitor 14, and the side surfaces and the bottom surface of the chip capacitor 14 are held by the insulating layer 115. That is, most of the bottom surface, the side surfaces, and the top surface of the chip capacitor 14 are directly held by the insulating layers 115 and 115A. This prevents the chip capacitor 14 from being pulled out when the temporary bonding tape 30 is peeled off in a manufacturing process.

As is understood from the above discussion, in the wiring board 100 according to the embodiment, the chip capacitor 14 can be held with sufficient strength by the insulating layers 115 and 115A and the extension 115D. As a result, in the manufacturing method of the wiring board 100 according to the embodiment, the probability of occurrence of defective products can be made low.

Next, another advantage of the wiring board 100 according to the embodiment will be described with reference to FIG. 12.

Figure 12:
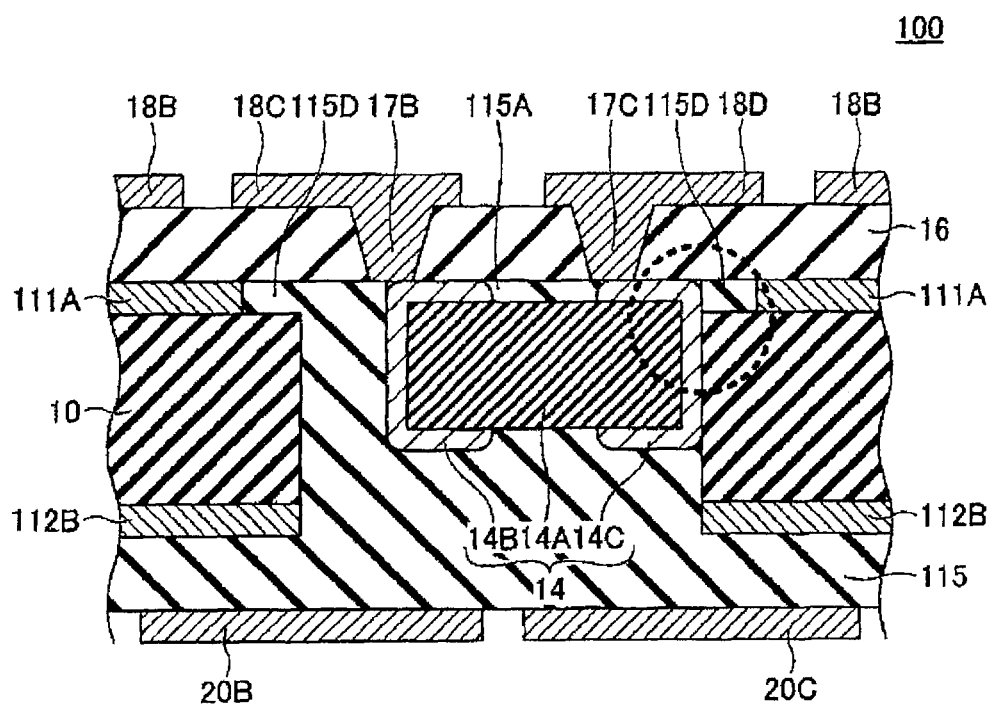
FIG. 12 illustrates another advantage of the wiring board 100 according to the embodiment.

FIG. 12 illustrates another advantage of the wiring board 100 according to the embodiment.

The chip capacitor 14 is held in the opening 111P and the through-hole 10P by the insulating layers 115 and 115A and the extension 115D.

However, in the example of FIG. 12, the chip capacitor 14 is deviated rightward from its position shown in FIG. 10C1, as in the example described with reference to FIG. 6 in Comparative Example.

In the wiring board 100 according to the embodiment, the opening 111P of the wiring layer 111A is larger than and includes the through-hole 10P in a plan view. Therefore, part of the extension 115D is formed on the destination side of the offset of the chip capacitor 14 with respect to the through-hole 10P.

Therefore, as shown in FIG. 12, even if the position of the chip capacitor 14 is deviated rightward, the terminal 14C of the chip capacitor 14 does not come into contact with the wiring layer 111A.

The same is true of a case that the position of the chip capacitor 14 is deviated leftward in FIG. 12; the terminal 14B does not come into contact with the wiring layer 111A. Likewise, even if the position of the chip capacitor 14 is deviated toward the viewer's side or the deep side in FIG. 12, the terminal 14B or 14C does not come into contact with the wiring layer 111A.

Therefore, in the wiring board 100 according to the embodiment, even if the position of the chip capacitor 14 is deviated, electric connection trouble of the chip capacitor 14 does not occur unlike in the wiring board 50 of Comparative Example. As such, the embodiment can provide a highly reliable wiring board 100.

As described above, the wiring board 100 according to the embodiment provides the advantages that sufficient strength of holding of an electronic component and high reliability can be secured.

Thus, the embodiment can provide a wiring board 100 that is increased in the strength of holding of an electronic component as well as in reliability.

Furthermore, in manufacturing process of the wiring board 100 according to the embodiment, the thickness of the adhesive layer 30B of the temporary bonding tape 30 may be about a half of that of the adhesive layer 30A which is used in Comparative Example. The use of such a thin adhesive layer 30B contributes to reduction of the manufacturing cost.

Whereas in the embodiment the wiring board 100 incorporates the chip capacitor 14 as an example electronic component, the wiring board 100 may incorporate another kind of electronic component such as a semiconductor device.

In the above-described embodiment, the opening 112P is larger than and includes the bottom open end of the through-hole 10P of the core 10 in a plan view. However, where as shown in FIG. 7A the vertical range where the chip capacitor 14 exists is included in the vertical range where the through-hole 10P plus the wiring layer 111A exist and the bottom surfaces of the terminals 14B and 14C are located higher than the wiring layer 112B, the opening 112P may have the same size and occupy the same area as the through-hole 10P in a plan view.

In the embodiment, no reference was made of the direction of peeling of the temporary bonding tape 30. For example, the temporary bonding tape 30 (assumed to have a rectangular shape in a plan view) may be peeled off in such a manner as to be pulled up starting from its one sideline. When the temporary bonding tape 30 is peeled off, pulling force acts on the chip capacitor 14 from the temporary bonding tape 30 via the terminals 14B and 14C.

In this case, peeling off the temporary bonding tape 30 in the direction in which the insulating layer 115A extends between the terminals 14B and 14C of the chip capacitor 14 (the vertical direction in FIG. 9B2) is preferable to peeling it off in the horizontal direction in FIG. 9B2.

This is because where the temporary bonding tape 30 is peeled off in the extending direction of the insulating layer 115A (the vertical direction in FIG. 9B2), the force acting on the chip capacitor 14 from the temporary bonding tape 30 can be made approximately constant in the interval where the temporary bonding tape 30 is in contact with the top surfaces of the insulating layers 115 and 115A and the extension 115D.

In contrast, where the temporary bonding tape 30 is peeled off in the horizontal direction in FIG. 9B2, the force acting on the chip capacitor 14 from the temporary bonding tape 30 varies to a relatively large extent in the interval where the temporary bonding tape 30 is in contact with at least one of the top surfaces of the insulating layers 115 and 115A and the extension 115D, depending on whether it is in contact with the insulating layer 115A.

It is therefore preferable to design the wiring board 100 so that the peeling direction of the temporary bonding tape 30 coincides with the extending direction of the insulating layer 115A.

However, if the strength of holding of the chip capacitor 14 by the insulating layers 115 and 115A and the extension 115D can be made so high that the peeling direction of the temporary bonding tape 30 is irrelevant, it is not necessary that the peeling direction of the temporary bonding tape 30 coincide with the extending direction of the insulating layer 115A.

It is preferable to design the wiring board 100 so that the ratio of the sum of the widths of the insulating layers 115 and 115A and the extension 115D in the direction perpendicular to the peeling direction of the temporary bonding tape 30 to that of the terminals 14B and 14C in the same direction is made as large as possible. Alternatively, it is preferable to design the wiring board 100 so that the sum of the widths of the insulating layers 115 and 115A and the extension 115D in the direction perpendicular to the peeling direction of the temporary bonding tape 30 is made as large as possible.

This is because the force acting on the chip capacitor 14 from the temporary bonding tape 30 can be reduced if the temporary bonding tape 30 is peeled off in such a direction that the sum of the widths of the insulating layers 115 and 115A and the extension 115D in the direction perpendicular to it is large, whereby the chip capacitor 14 can be prevented from pulled out by the temporary bonding tape 30.

If the aspect ratios of the insulating layer 115 and the extension 115D are different from each other (e.g., see FIG. 9B2), satisfactory results would be obtained by peeling the temporary bonding tape 30 in the direction in which their shorter sidelines extend.

However, if the strength of holding of the chip capacitor 14 by the insulating layers 115 and 115A and the extension 115D can be made so high that the peeling direction of the temporary bonding tape 30 is irrelevant, it is not necessary to set the above-described ratio of the sum of their widths large.

The epoxy, polyimide, or like resin material of the insulating layers 115 and 115A and the extension 115D may be different from that of the insulating layer 16 in melt viscosity or the coefficient of thermal expansion (CTE).

For example, the epoxy, polyimide, or like resin material of the insulating layers 115 and 115A and the extension 115D may be lower in melt viscosity and larger in the coefficient of thermal expansion that of the insulating layer 16.

In this case, gaps can be filled efficiently that might otherwise be formed between the insulating layers 115 and 115A and the extension 115D in the opening 111P, the groove 14D, etc. and the insulating layer 16 when the insulating layer 16 is formed with resin material such as the epoxy, polyimide or the like after the insulating layers 115 and 115A and the extension 115D is formed with resin material such as the epoxy, polyimide or the like.

Furthermore, since the insulating layer 16 is formed with resin material such as an epoxy, polyimide or the like that is softer and has a larger coefficient of thermal expansion after the formation of the insulating layers 115 and 115A and the extension 115D, the flatness of the wiring board 100 as a whole can be increased.

In the wiring board 100 according to the embodiment, the chip capacitor 14 is disposed closer to one surface (the top surface) of the core 10. Where the LSI chip 42 is mounted on the one surface of the core 10 (see FIG. 7D), the distance between the chip capacitor 14 and the LSI chip 42 can be made short and hence the performance of the LSI chip 42 can be enhanced.

Grooves that communicate with the opening 111P may be formed through the wiring layer 111A.

Figure 13:
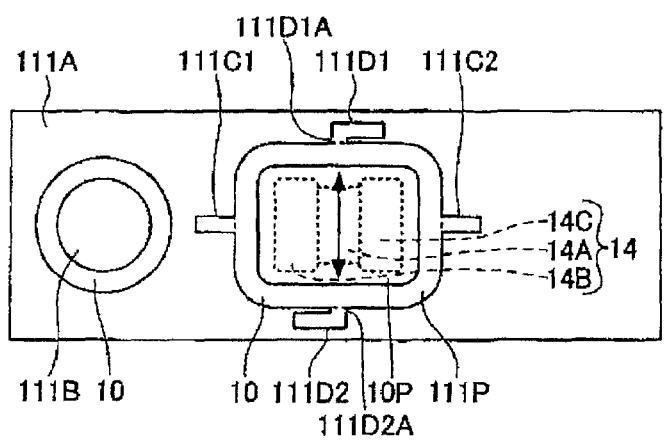
FIG. 13 is a plan view of a part of a wiring board 100A according to a modification of the embodiment.

FIG. 13 is a plan view of a part of a wiring board 100A according to a modification of the embodiment. FIG. 13 corresponds to FIG. 8C2 which shows a manufacturing step.

As shown in FIG. 13, grooves 111C1, 111C2, 111D1, and 111D2 may be formed through the wiring layer 111A so as to communicate with the opening 111P (extend from the four respective sidelines of the opening 111P). Portions of the top surface of the core 10 are exposed at the bottoms of the respective grooves 111C1, 111C2, 111D1, and 111D2. The grooves 111C1, 111C2, 111D1, and 111D2 are examples of a second groove.

The grooves 111C1 and 111C2 are formed so as to extend straightly outward from the two respective shorter sidelines of the opening 111P which is generally rectangular in a plan view, in the directions that are perpendicular to those sidelines.

The grooves 111D1 and 111D2 are formed so as to extend in L-shaped form from the two respective longer sidelines of the opening 111P.

Roots 111D1A and 111D2A where the grooves 111D1 and 111D2 are connected to the opening 111P, respectively, are located at such positions as to be aligned with the groove 14D of the chip capacitor 14 in the manufacturing step of FIGS. 9A1 and 9A2. That is, the roots 111D1A and 111D2A of the grooves 111D1 and 111D2 are located on respective extensions of the groove 14D. In other words, the line connecting the roots 111D1A and 111D2A of the grooves 111D1 and 111D2 is in the same direction as the extending direction of the groove 14D.

The grooves 111D1 and 111D2 can serve as spaces for receiving an excess part of an epoxy, polyimide, or like resin material that is charged into the space closed by the wiring layer 111A and the temporary bonding tape 30 by pressurization when the insulating layers 115 and 115A and the extension 115D are formed with the epoxy, polyimide, or like resin material (see FIGS. 9B1 and 9B2).

If high charging pressure is exerted on the groove 14D located between the terminals 14B and 14C of the chip capacitor 14 when resin is charged into the groove 14D, the chip capacitor 14 directly pushes up the temporary bonding tape 30 and hence is likely separated from the temporary bonding tape 30. The grooves 111D1 and 111D2 are formed in the vicinities of the groove 14D to facilitate escape of the pressure that is exerted on the groove 14D.

Since resin goes into the groove 14D in the vertical direction in FIG. 13 as indicated by an arrow, the groove 14D which extends in this direction facilitates escape of the pressure more.

As such, the grooves 111C1, 111C2, 111D1, and 111D2 can receive an excess part of an epoxy, polyimide, or like resin material when it is charged into the opening 111P by pressurization.

In this action, since the grooves 111C1 and 111C2 are formed at the positions that are most distant from the groove 14D of the chip capacitor 14, they can receive an excess part of the epoxy, polyimide, or like resin material efficiently at the two shorter sidelines of the opening 111P.

Since the roots 111D1A and 111D2A of the grooves 111D1 and 111D2 which are located on the respective extensions of the groove 14D, they can receive an excess part of the epoxy, polyimide, or like resin material efficiently.

FIG. 13 shows the mode in which the grooves 111C1, 111C2, 111D1, and 111D2 are terminated at the deepest positions and formed independently of each other. Alternatively, at least two (e.g., three) of them may communicate with each other. All of the grooves 111C1, 111C2, 111D1, and 111D2 may communicate with each other.

The wiring board and its manufacturing method according to the illustrative embodiment of the invention have been described above. However, the invention is not limited to the embodiment which has been disclosed above in a specific manner and various changes and modifications are possible without departing from the scope of the claims.

What is claimed is:

1. A wiring board comprising:
a core layer having a through hole therethrough and comprising a first surface and a second surface opposite to the first surface;
a first wiring layer formed on the first surface of the core layer and having a first opening which is communicated with the through hole, wherein an opening area of the first opening is larger than that of the through hole in a plan view,
an electronic component disposed in the through hole and the first opening and comprising: a first surface; a second surface opposite to the first surface; and a side surface between the first surface and the second surface, the electronic component further comprising a pair of terminals that are insulated from each other and are each formed to extend continuously on the first surface of the electronic component, the second surface of the electronic component, and the side surface of the electronic component, wherein the first surface of the electronic component is located on a side of the first surface of the core layer and the second surface of the electronic component is located on a side of the second surface of the core layer;
a first resin layer filled in the through hole, the first opening and a gap between the pair of terminals so as to cover the second surface and the side surface of the electronic component;
a second resin layer which is directly formed on the first surface of the core layer, a surface of the first wiring layer, and surfaces of the pair of terminals of the electronic component; and
a via electrode formed through the second resin layer and electrically connected to the pair of terminals.

2. The wiring board of claim 1, wherein the second resin layer is made of a resin different from the first resin layer.

3. The wiring board of claim 1, wherein
the first wiring layer further has a groove which is communicated with the first opening and extends outwardly from the first opening in the plan view.

4. The wiring board of claim 1, wherein
a surface of the first wiring layer, surfaces of the pair of terminals and a surface of the first resin layer are substantially flush with each other.

5. A semiconductor device comprising:
the wiring board of claim 1; and
a semiconductor element disposed on the wiring board.

6. The semiconductor device of claim 5, wherein the second resin layer is made of a resin different from the first resin layer.

* * * * *